United States Patent
Heuser et al.

(10) Patent No.: US 8,580,392 B2
(45) Date of Patent: Nov. 12, 2013

(54) ORGANIC LIGHT-EMITTING DIODE AND USES THEREOF

(75) Inventors: Karsten Heuser, Erlangen (DE); Arvid Hunze, Erlangen (DE); Andreas Kanitz, Hoechstadt (DE); Wolfgang Rogler, Moehrendorf (DE); Debora Henseler, Erlangen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 1202 days.

(21) Appl. No.: 11/547,205

(22) PCT Filed: Mar. 23, 2005

(86) PCT No.: PCT/EP2005/051349
§ 371 (c)(1),
(2), (4) Date: Oct. 8, 2007

(87) PCT Pub. No.: WO2005/096402
PCT Pub. Date: Oct. 13, 2005

(65) Prior Publication Data
US 2009/0289544 A1 Nov. 26, 2009

(30) Foreign Application Priority Data
Mar. 31, 2004 (DE) .......................... 10 2004 015 845

(51) Int. Cl.
*H01L 51/54* (2006.01)

(52) U.S. Cl.
USPC ........... 428/690; 313/504; 313/505; 313/506; 257/E51.05; 257/E51.026; 257/E51.032; 528/4; 528/394; 528/297; 528/422

(58) Field of Classification Search
USPC .................. 428/690, 917; 313/504, 505, 506; 257/40, E51.05, E51.026, E51.032; 528/4, 394, 397, 422
See application file for complete search history.

(56) References Cited

U.S. PATENT DOCUMENTS

| 2003/0006411 | A1 | 1/2003 | Kido et al. | |
| 2005/0170202 | A1* | 8/2005 | Tamao et al. | 428/690 |
| 2006/0182993 | A1 | 8/2006 | Ogata et al. | |
| 2006/0229431 | A1* | 10/2006 | Kanitz et al. | 528/394 |

FOREIGN PATENT DOCUMENTS

| DE | 10320713 | | 5/2003 |
| DE | 102004001865 | A1 | 12/2004 |
| EP | 1 142 895 | A1 | 10/2001 |
| JP | 2001-284052 | A | 10/2001 |
| JP | 2003-031365 | | 1/2003 |
| JP | 2004-162011 | | 6/2004 |
| JP | 2005-093427 | | 4/2005 |
| JP | 2005-093428 | | 4/2005 |
| WO | WO 02/092724 | A1 | 11/2002 |
| WO | WO 03/035796 | A1 | 5/2003 |
| WO | WO 2004/003053 | * | 1/2004 |
| WO | WO 2004/003053 | A1 | 1/2004 |

OTHER PUBLICATIONS

Yuan et. al., . . . Optical propeties of three-coordinate organoboron compounds, 2000, J of Solid State Chemistry, vol. 154, pp. 5-12.*
Chujo et. al., Poly(p-phenylene-borane)s . . . , 1998, J of Am. Chem. Soc., vol. 120, pp. 10776-10777.*
Office Action, Japanese Application No. 2007-505547, mailed Jan. 21, 2011 (9 pages).
International Search Report and Written Opinion, International Application Serial No. PCT/EP2005/051349, Sep. 26, 2005, 8 pp.

* cited by examiner

*Primary Examiner* — Gregory Clark
(74) *Attorney, Agent, or Firm* — Fish & Richardson P.C.

(57) ABSTRACT

The invention relates to an organic light-emitting diode (OLED) having an improved lifetime and improved transport of negative charge carriers. The organic light-emitting diode is based on an organic semiconductor material, in which the transport of negative charge carriers and stability with respect to reduction is achieved with triarylated Lewis acid units, in particular perarylated borane units. This leads to an improved lifetime of the emission layer which in turn increases the lifetime of the component and eliminates the need for correcting brightness during operation. Furthermore, the invention relates to organic light-emitting diodes in which the position of the emission zone in the emitter layer and the color of the emission can be influenced in a targeted manner through triarylated Lewis acids such as perarylated borane units.

14 Claims, No Drawings

ORGANIC LIGHT-EMITTING DIODE AND USES THEREOF

BACKGROUND

The invention relates to an organic light-emitting diode (OLED) having an improved lifetime and improved transport of negative charge carriers.

OLEDs based on semiconductor material are known having, for example, a matrix of polyarylenevinylene or polyparaphenylene (in particular polyfluorene and/or polyspirofluorene), in which other chromophores and/or triarylamine derivatives are polymerized in addition to these components or are introduced in the matrix to form of blends. As a rule, chromophores produce strong long-wavelength emission bands, i.e., essentially green or red, in the resulting electroluminescence spectra. The triarylamine units typically have little influence on the emission spectrum of the organic light-emitting diodes and serve primarily to transport positive charges over the thoroughly conjugated polymer chain and/or improve the oxidation stability of the organic semiconductor material.

With the organic semiconductor materials described above for active layers of an OLED, it is currently possible to cover a large range of possible CIE color coordinates and achieve relatively high luminous densities and efficiencies that would be relevant for commercial applications. However, the useful life of polymer OLEDs is still too low to be successful in the marketplace. This is true in particular of the shorter wavelength light-emitting diodes, i.e., the blue- and white-emitting LEDs and/or displays such as the so-called passive matrix displays.

A fundamental problem with the useful life of polymer OLEDs is the resistance to reduction of the organic semiconductor material. This problem is crucial because in an organic semiconductor material, charge transport is accomplished via individual oxidation and reduction reactions, where a subunit involved in charge transport must typically be oxidized or reduced several billion times during the useful life of the component. Irreversible chemical degradation during such a process results in a worsening of charge transport properties and at the same time a reduction in luminous density.

The object of the present invention is therefore to create an organic light-emitting diode using a semiconducting organic material having increased redox stability so that it will have a longer useful life.

SUMMARY

The subject matter of the present invention is an organic light-emitting diode or luminous display having an active layer of an organic semiconductor material into which at least partially triaryl-substituted Lewis acid units are polymerized and/or incorporated as a polymer component in a blend. In addition, the subject matter of this invention is the use of the organic light-emitting diodes for lighting purposes and/or for monochromatic, multicolor or full-color organic luminous displays based on color filters or structured RGB-pixelated emitter layers and for passive matrix displays.

DETAILED DESCRIPTION

An organic light-emitting diode includes at least one substrate, a transparent bottom electrode layer, at least one active layer and one top electrode layer. The organic light-emitting diode is advantageously encapsulated to protect it from adverse environmental influences.

The phrase "polymerized [into it] and/or incorporated as a polymer component in a blend" is to be understood in this context as meaning that the triaryl-substituted Lewis acid units are either copolymerized in a copolymer with other units, such as polyarylenevinylene or polyparapheylene (in particular polyfluorene and/or polyspirofluorene) units or that a blend is used in which the triaryl-substituted Lewis acid units have been mixed (blended) as a polymer with at least one other organic semiconducting polymer material. These two alternatives may also occur simultaneously, so that both a blend of several polymers, including a polymer material comprising triaryl-substituted Lewis acid units and, a copolymer having a recurring unit comprising a triaryl-substituted Lewis acid, are used.

The triaryl Lewis acid units improve the transport of negative charge carriers and increase the stability of the polymer with regard to electrochemical reduction, which occurs unavoidably during transport of the negative charge carriers.

A Lewis acid is an electron pair acceptor, i.e., a molecule or ion having an incomplete electron configuration, which may pick up a pair of electrons, i.e., a negative charge. Triaryl Lewis acid units are especially suitable for use as electron transporting components of an organic semiconductor copolymer material because not only can they take up a negative charge but also they can be stabilized by the aryl radicals.

Suitable luminous acids include, for example, those having a boron or an aluminum atom as the central atom, where the aluminum Lewis acids for use herein must additionally have a complex bound to the aromatic system for stability reasons. Triaryl Lewis acids with boron as the central atom are especially suitable because a boron containing anion is resistant to reduction. In contrast with the highly reactive radical carbanions of a conjugated hydrocarbon system, no irreversible secondary reactions are expected here. This concept is confirmed, for example, by cyclovoltametric measurements on trimesitylborane, which exhibit a completely reversible reduction of the triarylborane unit.

Using triaryl Lewis acid units as stable electron transport units for negative charges is similar to the known use of triarylamine derivatives as a stable hole transport unit for positive charges. Although the negative or positive charge carriers are stabilized at the Lewis acid central atom or nitrogen atom, charge transport to the next stabilizing subunit is nevertheless possible, in addition to conjugation of the carbon structure. This has long been known for triarylamine derivatives and is confirmed by preliminary results with pure triarylborane polymer as the transport material for negative charges, as described in the as yet unpublished patent applications DE 103 20 713.9 and 10 2004 001 865.0.

The triarylated Lewis acid units are advantageously borane units.

The aryl substituents may be the same or different. Aryl substituents are understood to refer to (homo)aromatic or heteroaromatic compounds. As a rule, at least two of the three aryl substituents are part of the polymer main chain, so the polymer main chain of at least one polymer constituent of the organic semiconductor material has an Ar—B(Ar)—Ar constituent.

According to one embodiment, the organic semiconductor material of at least one active layer of the OLED comprises 50% of the recurring units of arylenevinylene units and/or paraphenylene derivative units and between 1% and 50% of the recurring units, preferably 1% to 30% and especially preferably 1% to 20% triaryl-substituted Lewis acid units. It is also preferred in particular that fluorene derivative units and/or polyspirofluorene units are used as the paraphenylene derivative units.

According to another embodiment, the organic semiconductor material of at least one active layer of the OLED also includes between 1% and 49% recurring units of triarylamine derivative units, in particular 1% to 30% recurring units of triarylamine units and especially preferably between 1% and 20% thereof.

According to one embodiment, the triarylated Lewis acid units in the organic semiconductor material have a blue emission or do not have any noticeable influence on the emission spectrum (a shift of less than 30 nm).

According to one embodiment of the invention, the triarylated Lewis acid units have electron donor substituents, resulting in a chromophore center, and there is a shift in emission into the long wavelength range.

In a particularly advantageous embodiment of the invention, triarylamine units and borane units are combined in an organic semiconductor material of at least one active layer in such a way that the efficiency and useful life are optimized to certain driver conditions, e.g., for passive matrix triggering at a given multiplex rate, pulse rate and/or brightness.

According to this invention, through the use of triarylborane electron transporter units, the amount of negative charge carriers in the total stream and thus the efficiency of the organic light-emitting diodes as well as the position of the recombination zone within the layer are optimized.

In a particularly preferred embodiment of the invention, the triaryl Lewis acid units (e.g., triarylborane units) do not have a significant influence on the electroluminescence of the semiconducting copolymer, so that despite these additional electron-transporting components, the emission of the polyarylenevinylene or polyparaphenylene basic structure and the emission of any chromophore components that might be present will dominate the spectrum. This is to be expected with simple triaryl substituents, e.g., phenyl or mesityl, because the electroluminescence of these isolated units is in the blue range.

On the other hand, the triaryl ligand on the Lewis acid central atom may also be electron-donor-substituted, so that then this unit can be altered to yield a chromophore center with emission shifted to the long wavelength range. OLEDs with such a design will emit in a broadband-modified emission.

The organic light-emitting diode or luminous display may be used for monochromatic, multicolor or full-color organic electroluminescence displays having active or passive matrix control.

According to an advantageous embodiment, they may be used for full-color organic electroluminescence displays on the basis of white emitters and color filters or on the basis of structured RGB-pixelated emitter layers.

Finally, the OLED according to this invention may be used so that the Lewis acid unit content is coordinated with the pulsed driver conditions in a passive matrix display.

This invention makes available for the first time an organic light-emitting diode having a triaryl Lewis acid component as an electron transporting unit in an organic semiconductive material of an active layer in which the problem of inadequate stability with respect to reduction of conjugated hydrocarbon polymers is overcome. Due to the perarylated Lewis acid units, reversible reducibility of the total organic semiconductor material of the active layer and thus a prolonged operating lifetime of the light-emitting diode are achieved. In addition, through targeted variation in the amount of triarylborane units, for example, as triaryl Lewis acid units, an improvement in efficiency and/or control of the position of the emission zone within the active layer of organic semiconductor material is made possible.

The invention relates to an organic light-emitting diode (OLED) having an improved lifetime and improved transport of negative charge carriers. The organic light-emitting diode based on an organic semiconductor material in which the transport of negative charge carriers and stability with regard to reduction are determined by triarylated Lewis acid units, in particular by perarylated borane units. This results in an improved lifetime of the emission layer, which increases the lifetime of the component on the one hand while also eliminating the need for correcting brightness during operation. Furthermore, the invention relates to organic light-emitting diodes in which the position of the emission zone in the emitter layer and the color of the emission can be influenced in a targeted manner through triarylated Lewis acids such as perarylated borane units.

We claim:

1. An organic light-emitting diode comprising an active layer of organic semiconductor material including at least partially triaryl-substituted Lewis acid units, which are polymerized or added as a polymer component to the organic semiconductor material to form a blend wherein:
   the Lewis acid units are borane units; and
   at least two of the three aryl substituents of the borane unit are part of a polymer main chain and not directly bonded to each other,
   wherein at least 50% of the recurring units of the organic semiconductor material are arylenevinylene units, paraphenylene derivative units or a combination thereof and between 1% and 50% of the recurring units are triaryl-substituted Lewis acid units; and
   wherein the paraphenylene derivative units are at least partially fluorene derivative units or polyspirofluorene.

2. An organic light-emitting diode according to claim 1, wherein the triaryl-substituted Lewis acid units are borane units of formula —Ar—B(Ar)—Ar—.

3. The organic light-emitting diode according to claim 1, wherein the triaryl-substituted Lewis acid units include at least one polycyclic aryl substituent.

4. The organic light-emitting diode according to claim 1, wherein the organic semiconductor material comprises between 1% and 49% of triarylamine derivative units.

5. The organic light-emitting diode according to claim 1, in which the triaryl-substituted Lewis acid units in the organic semiconductor material are configured to emit blue light.

6. The organic light-emitting diode according to claim 1, in which the triaryl-substituted Lewis acid units in the organic semiconductor material shift the emission spectrum of the organic semiconductor material by less than 30 nm.

7. The organic light-emitting diode according to claim 1, in which the triaryl-substituted Lewis acid units in the organic semiconductor material act at least partially as chromophores by shifting the emission spectrum of the organic semiconductor material to a longer wavelength than the organic semiconductor material without the Lewis acid units.

8. A method of using the organic light-emitting diode according to claim 1, comprising triggering the light-emitting diode to produce broadband white light.

9. A method of using the organic light-emitting diode according to claim 1, comprising triggering the light-emitting diode to produce light.

10. A method of using the organic light-emitting diode of claim 1, comprising triggering the light-emitting diode to produce monochromatic, multicolor or full-color organic electroluminescence display, wherein the triggering is active or passive matrix triggering.

11. The method according to claim 10, further comprising emitting light from the light-emitting diode through color filters.

12. A method of using the organic light-emitting diode according to claim 1, in which the Lewis acid unit content is coordinated with pulsed driver conditions in a passive matrix display, the method comprising driving the organic light-emitting diode.

13. The method according to claim 10, wherein triggering the light-emitting diode comprises triggering a light-emitting diode with structured RGB-pixelated emitter layers.

14. The organic light-emitting diode according to claim 1, wherein the aryl substituents are homoaromatic or heteroaromatic compounds.

* * * * *

UNITED STATES PATENT AND TRADEMARK OFFICE
CERTIFICATE OF CORRECTION

PATENT NO.       : 8,580,392 B2
APPLICATION NO.  : 11/547205
DATED            : November 12, 2013
INVENTOR(S)      : Karsten Heuser et al.

It is certified that error appears in the above-identified patent and that said Letters Patent is hereby corrected as shown below:

Title page, col. 2, under item (56), (Other Publications), line 1, Yuan et al. reference, delete "propeties" and insert -- properties --

Signed and Sealed this
Twenty-second Day of April, 2014

Michelle K. Lee
*Deputy Director of the United States Patent and Trademark Office*